United States Patent [19]

Clawson et al.

[11] Patent Number: 5,111,991
[45] Date of Patent: May 12, 1992

[54] METHOD OF SOLDERING COMPONENTS TO PRINTED CIRCUIT BOARDS

[75] Inventors: Robert A. Clawson, Kokomo, Ind.; John R. Thome, Fort Worth, Tex.

[73] Assignee: Motorola, Inc., Schaumburg, Ill.

[21] Appl. No.: 601,541

[22] Filed: Oct. 22, 1990

[51] Int. Cl.⁵ .............................................. B23K 31/02
[52] U.S. Cl. .................................. 228/180.1; 228/227
[58] Field of Search ................. 228/180.1, 180.2, 214, 228/207, 208, 245, 254, 227, 228

[56] References Cited

U.S. PATENT DOCUMENTS

| | | | |
|---|---|---|---|
| 2,803,731 | 8/1957 | Coburn | 228/180.1 |
| 3,292,240 | 12/1966 | McNutt et al. | 228/254 |
| 3,583,063 | 6/1971 | Growney | 228/180.1 |
| 4,127,692 | 11/1978 | Boynton | 228/180.1 |
| 4,789,096 | 12/1988 | Dunn et al. | 228/240 |
| 4,821,948 | 4/1989 | Fisher et al. | 228/180.1 |
| 4,838,475 | 6/1989 | Mullins et al. | 228/180.2 |
| 4,883,214 | 11/1989 | Zimmer | 228/180.2 |

OTHER PUBLICATIONS

Hendriks and Inpyn, "Fluxless SMD Soldering", Circuits Manufacturing, Oct. 1984, pp. 40-44.

Primary Examiner—Richard K. Seidel
Assistant Examiner—Chuck Y. Mah
Attorney, Agent, or Firm—Dale W. Dorinski; Daniel K. Nichols

[57] ABSTRACT

The need for solder paste or wave soldering to assemble printed circuit boards and components is eliminated by applying (100) a layer of solder to the exposed metal pads, annular rings and plated through holes of the printed circuit board. Leadless components are placed into a layer of 'tack' flux applied (110) to the printed circuit board (120). The printed circuit board is heated to reflow (130) leadless components, and the solder in the holes is melted (140). The leads of the leaded components are heated (150) and inserted (160) into the molten solder in the holes. The assembly is then cooled (170) to solidify the solder around the component.

22 Claims, 2 Drawing Sheets

METHOD OF SOLDERING COMPONENTS TO PRINTED CIRCUIT BOARDS

TECHNICAL FIELD

This invention relates generally to methods of assembling electronic circuits, and more specifically to a method of assembling electronic circuits without the use of solder paste or wave soldering, and most particularly to a method of high temperature insertion of leaded components into printed circuit boards.

BACKGROUND

Present board assembly processes using reflow soldering require the use of solder paste to provide solder necessary to form solder joints between components and the printed circuit board. This requires that solder paste be applied using either printing with a solder stencil or screen, or by dispensing the paste with a syringe. Syringe application is very time consuming, while screen printing requires use of a stencil which is unique to each circuit board and requires setup with associated delays in production cycle time and throughput. The use of solder paste requires precise control of the chemistry and rheology of the paste in order to insure that a material with both acceptable stencil printing and soldering characteristics is provided. For example, to insure acceptable printing characteristics, a liquid vehicle and binding agents must be added, constituting about 50% by volume of the paste. The binding agents are generally some form of resin which also assists in the soldering process. These resins remain behind after solder reflow and must be removed from the board by washing with ozone-depleting chloroflorocarbon solvents to allow probe testing of the boards after reflow and to insure reliability. In wave soldering, it has been possible to reduce the solids in the flux so that the small amount of residues remaining after soldering do not interfere with testing. Because of the liquid vehicle requirements for solder paste, this has so far been impossible to achieve for reflow processes.

Because of the complex makeup of the solder paste, it is, of necessity, an expensive material, and a significant cost advantage could be accrued by eliminating it from a process. One method of eliminating solder paste is to provide printed circuit boards with a precoating of solder covering the underlying copper conductors. Methods of providing a thick solder coating using plating methods have been documented in the literature. For example, "Fluxless SMD Soldering" by Hendricks and Inpyn of General Electric Company in *Circuits Manufacturing*, October 1984, details the use of heavy solder plating to assemble printed circuit boards and leadless components. Other methods of providing solder plating, such as dipping, have been used, but results in coatings that are thin in some areas and thick in other areas, allowing an intermetallic compound of copper and tin to be exposed to the oxidizing environment of the atmosphere. When this occurs, the board becomes unsolderable, defeating the intention of the solder coating. In addition, dipping results in the plated through holes of the circuit board becoming filled with solder, preventing the insertion of leaded components into the holes.

By limiting the use of flux or vehicle in solder paste and wave solder operations, the board assembly process becomes simplified and reduces materials, labor and cycle time and increases quality. Elimination of flux and vehicle also eliminate the need to clean the circuit board after soldering. In addition, elimination of solder paste and wave soldering also would reduce the incidence of solder balls and solder shorting resulting from the reflow or wave soldering operations.

When boards are plated with heavy coatings of solder, they must still be reflowed in order to insure adequate alloying of the solder to the underlying copper. This reflowing procedure is known as fusing, and when heavy coatings of solder are fused, the solder wets and flows into the plated through holes thereby blocking the plated through holes and preventing insertion of leaded components.

Clearly, these methods of eliminating solder paste or wave soldering are suitable for use in surface mounted components, where all components are placed on the surface of the printed circuit board. However, all of the previous methods result in filling the plated through hole with a solder plug, making it impossible to insert leaded components into the holes. An improved method of assembling printed circuit assemblies that eliminates solder paste and provides a means to utilize leaded components is certainly desirable.

SUMMARY OF THE INVENTION

Briefly, according to the invention, a method of forming a printed circuit assembly consisting of a printed circuit board and leaded components is disclosed. The need for solder paste or wave soldering the printed circuit board assembly is eliminated by applying a layer of solder to the exposed metal pads, annular rings, and plated through holes of the printed circuit board. The printed circuit board is heated to reflow the leadless components, and the solder in the holes is melted. The leads of the leaded components are heated and inserted into the molten solder in the holes. The assembly is then cooled to solidify the solder around the component.

DETAILED DESCRIPTION OF THE PREFERRED EMBODIMENT

Figure 1:
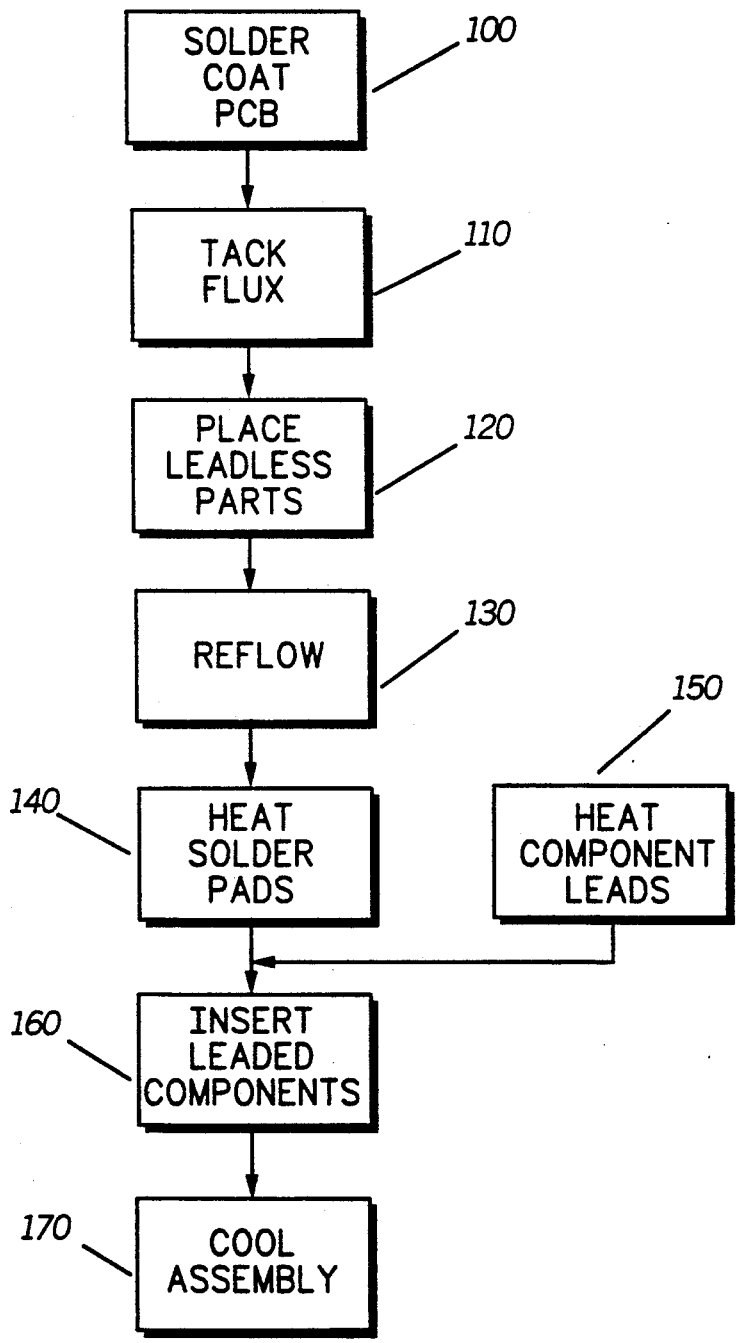
FIG. 1 is a process flow of the preferred embodiment of the invention.

Solder required to accomplish the formation of solder joints is provided on the printed circuit board by plating heavy layers of solder onto the circuit board or by dipping the circuit board into a molten solder bath. Methods of dipping into a molten solder bath are common and are known as the Gyrex ® process. During this process, as the board is extracted from the molten solder, a heated stream of air is directed onto the circuit board in order to remove excess solder and provide a thin, uniform layer of solder over the board. The heated air stream also clears the plated through holes of solder. However, the normal Gyrex ® process results in a layer of solder that is not of adequate thickness to provide the necessary solder fillets for the components during reflow. Therefore, a modification in the Gyrex ® process, reducing the velocity of the heated air stream, is necessary to insure that a heavy coating of solder remains on the circuit board. In so doing, the plated through holes are no longer cleared by the steam of air and the resultant circuit board has plated through holes that are blocked or plugged with solder. The amount of solder retained on the circuit board is a function of variations such as the printed circuit board pad design and solder dipping variables such as temperature, direction of the board, speed of withdrawal, flux activity, etc. Optimization of these variables will result in the proper amount of solder to be provided for specific components. In soldering fine pitch chip carriers, a smaller amount of solder is generally required than for larger chip components in order to avoid solder shorts.

In the case of Gyrex ® and hot air leveling, the thickness of the resulting deposit is too thin to provide sufficient solder for reliable solder joints. The reason for this is that in the Gyrex ® process, a stream of high pressure air is impinged on the printed circuit board as it is extracted from the molten solder bath in order to remove excess solder from the through hole terminations. This air stream also removes most of the solder from the pads, leaving an insufficient amount remaining for forming solder joints for electronic components. In the case of thick plating and subsequent hot air leveling or fusing, the length of time required to plate sufficient solder alloy is excessively long, requiring the circuit board panel to remain in the plating bath for times in excess of 24 hours. This long plating time affects the board materials, and presents an environmental hazard because of the poisonous effluents generated by the tin/lead plating process. For these reasons, the method of choice for depositing the required amount of solder onto the circuit board is the solder dip process without the use of high pressure air traditionally used to clear the through holes of solder. In addition to being processed by vertically dipping the circuit board into molten solder, the circuit board panel may also be coated horizontally using a solder wave or any similar method to provide a thick coating of solder. This thick layer eliminates the danger of exposure of the inner metallic copper to the atmosphere, thus eliminating solderability problems caused by thin intermetallic oxidation.

Referring to FIG. 1, the preferred embodiment, after the solder is coated on the printed circuit board at step 100, a thin layer of flux is applied (110) to the board by either roller coating, spraying, or dipping and coating all or part of the board. This 'tacking' flux provides the adhesion or tack characteristics that solder paste normally would provide to aid in temporary positioning of surface mount components without leads. The surface mount parts are now placed onto the circuit board (120) and held in place by the tack flux. The assembly is reflowed (230) using methods such as infrared, vapor phase, conduction heating, or other methods well known to those skilled in the art.

In order to insert wires or leaded components such as resistors, capacitors and the like into the plated through holes that are blocked with solder, the solder must be melted (140) prior to insertion of the lead. The printed circuit board may be maintained at the reflow temperature, keeping the solder molten, or it may be allowed to cool and the solder remelted as required. Additional heat may be applied to the solder by directing a heated stream of nitrogen or other gas at the plated through hole to melt the solder. At the same time, the leads of the component or device are heated (150). Methods of heating the leads may be by means of a heated stream of gas, a heated bar or tool, induction heating, infrared heating, or other methods known to those skilled in the art. The purpose of heating the component leads is to bring the lead to a temperature near or exceeding the melting point of the solder, such that when the lead is inserted (160) into the plated through hole, the solder in the plated through hole will remain molten and allow the lead to cleanly pass through. Once the component is placed into the plated through hole, heat is removed from the printed circuit board and the component lead allowing the molten solder in the plated through hole to cool (170) and form a metallurgical joint around the component lead. Alternatively, the use of flux on the component lead may also be used to improve wetting of the leads to the solder.

Figure 2:
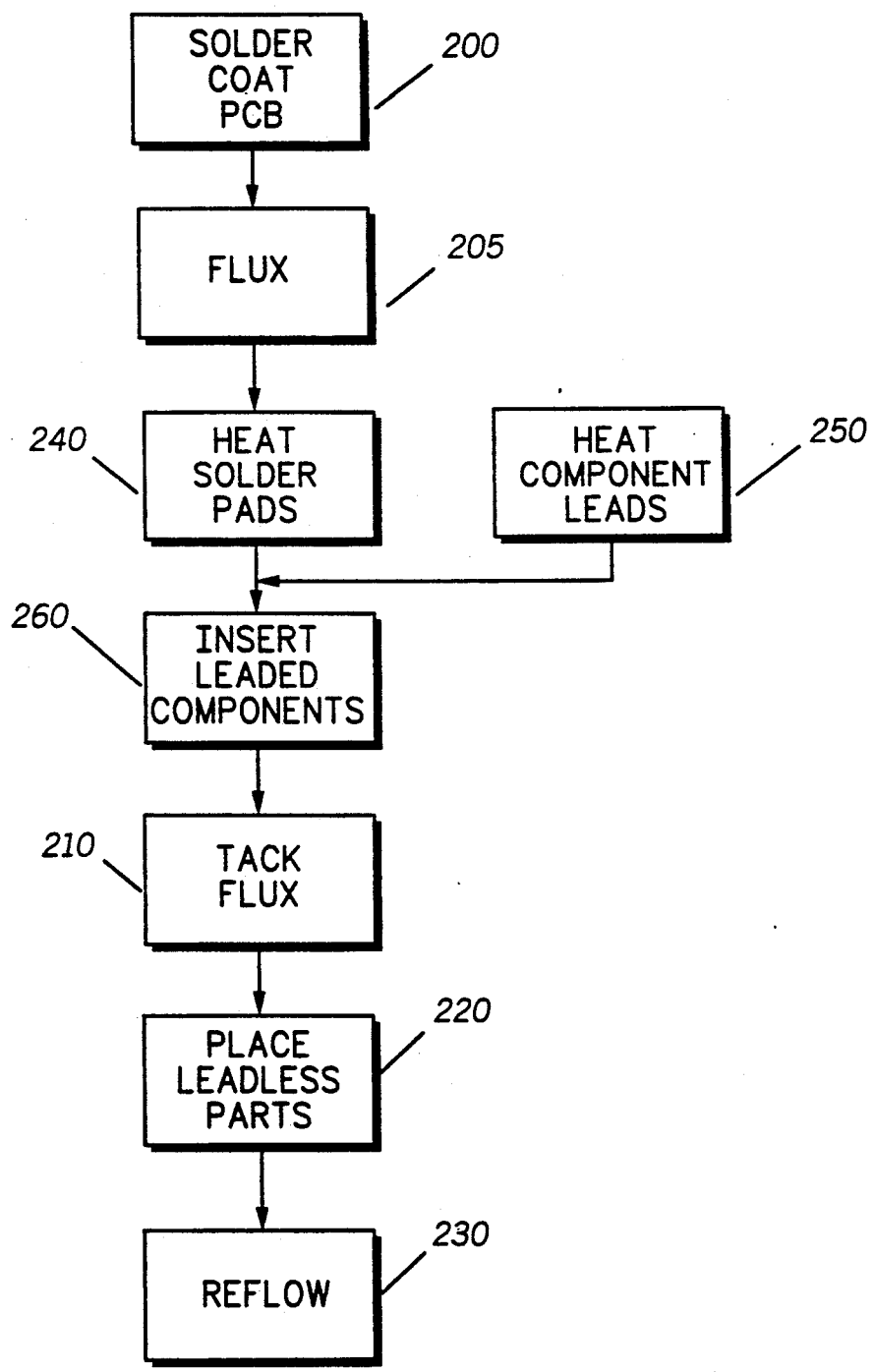
FIG. 2 is a process flow of an alternate embodiment of the invention.

An alternate embodiment shown in FIG. 2, utilizes solder coated on the printed circuit board at step 200. A thin layer of flux is applied (205) to the board by either roller coating, spraying, or dipping and coating all or part of the board, in order to provide some fluxing action for the leaded components. Alternatively, the use of flux on the component lead may also be used to improve wetting of the leads to the solder. In order to insert leaded components into the plated through holes that are blocked with solder, the solder must be melted (240) prior to insertion of the lead. To accomplish this, a heated stream of nitrogen or other gas is directed at the plated through hole to melt the solder. At the same time, the leads of the component or device are heated (250). Methods of heating the leads may be by means of a heated stream of gas, a heated bar or tool, induction heating, resistance heating, infrared heating, or other methods known to those skilled in the art. The purpose of heating the component leads is to bring the lead to a temperature near or exceeding the melting point of the solder, such that when the lead is inserted (260) into the plated through hole, the solder in the plated through hole will remain molten and allow the lead to cleanly pass through. Once the component is placed into the plated through hole, heat is removed from the printed circuit board and the component lead. A thin layer of 'tack' flux is applied (210) to the board by either roller coating, spraying, or dipping and coating all or part of the board. This 'tacking' flux provides the adhesion or tack characteristics that solder paste normally would provide to aid in temporary positioning of components. The surface mount parts are now placed onto the circuit board (220) and held in place by the tack flux. The assembly is reflowed (230) using methods such as infrared, vapor phase, conduction heating, or other methods well known to those skilled in the art.

In yet another embodiment, surface mount components may be soldered in place in a manner similar to that utilized for the leaded components. A thin coating of flux is applied to either the circuit board pads or the component terminations, and the board is heated to melt the solder. The terminations of the leadless component are heated and the component placed into the molten solder. Once the component is soldered, heat is removed from the printed circuit board and the component, allowing the molten solder to cool and form a metallurgical joint around the component termination.

It should be appreciated from the above embodiments that many advantages accrue from the use of this method. Most specifically, components that are sensitive to elevated temperatures and are not suitable for soldering in place using conventional reflow techniques may be soldered without damage, using the method of the invention. It should be understood that modifications to the process by use of only surface mount components, only leaded components, or mixtures of both types of components are well within the spirit of the invention.

What is claimed is:

1. A method of manufacturing printed circuit assemblies having a printed circuit board and components, comprising:
   applying solder material to exposed metal pads of the printed circuit board;
   applying heat to the printed circuit board, to effect melting of at least a portion of the solder material;
   applying heat to the components;
   placing the heated components into the molten solder; and
   cooling the assembly to solidify the solder material.

2. The method of claim 1, wherein the printed circuit board contains at least one plated through hole, the plated through hole being at least partially filled with solder.

3. The method of claim 2, wherein the component has at least one lead.

4. The method of claim 3, wherein the component lead is placed in the molten solder in the plated through hole.

5. The method of claim 1, wherein heat is applied to the solder material by a stream of heated gas.

6. The method of claim 1, wherein heat is applied to the component by means of a stream of heated gas.

7. The method of claim 1, wherein heat is applied to the component by means of induction heating.

8. The method of claim 1, wherein heat is applied to the component by means of a heated tool.

9. The method of claim 1, wherein heat is applied to the component by means of infrared heating.

10. The method of claim 1, wherein heat is applied to the component by means of resistance heating.

11. The method of claim 1, wherein the solder is applied to the printed circuit board by means of plating.

12. The method of claim 11, wherein the solder is fused after plating.

13. The method of claim 1, wherein the solder is applied to the printed circuit board by means of solder paste.

14. The method of claim 13, wherein the solder paste is reflowed.

15. The method of claim 1, wherein the solder is applied to the printed circuit board by means of dipping.

16. The method of claim 15, wherein the excess solder is removed by means of a heated air stream.

17. The method of claim 1, wherein the printed circuit assembly contains surface mounted components.

18. The method of claim 1, wherein the step of applying solder material further comprises cleaning the printed circuit board after applying the solder material.

19. The method of claim 1, wherein the step of applying heat to the printed circuit board further comprises applying a flux to the solder material.

20. The method of claim 19, wherein the flux is applied by roller coating, spraying, dipping, printing, or dispensing.

21. A method of manufacturing printed circuit assemblies having a printed circuit board and leaded components, comprising:
   applying solder material to exposed metal of the printed circuit board, a portion of the metal comprising plated through holes substantially filled with solder material;
   applying heat to the printed circuit board, to melt at least a portion of the solder material in the holes;
   applying heat to the leads of the components;
   inserting the heated component leads into the melted solder material in the plated through holes in the printed circuit board; and
   cooling the assembly to solidify the solder material.

22. A method of manufacturing printed circuit assemblies having a printed circuit board, leaded components, and surface mounted components, comprising:
   applying solder material to exposed metal pads of the printed circuit board by dipping, a portion of the pads comprising plated through holes, and removing the excess solder by means of a heated air stream;
   applying flux to the metal pads;
   applying heat to the printed circuit board, to melt at least a portion of the solder material in the holes;
   applying heat to the leads of the components;
   inserting the heated component leads into the melted solder material in the plated through holes in the printed circuit board; and cooling the assembly to solidify the solder material.

* * * * *